(12) United States Patent
Yoshikawa et al.

(10) Patent No.: US 9,689,066 B2
(45) Date of Patent: *Jun. 27, 2017

(54) PHOTOMASK BLANK MANUFACTURING METHOD, PHOTOMASK BLANK, PHOTOMASK, AND PATTERN TRANSFER METHOD

(71) Applicant: Shin-Etsu Chemical Co., Ltd., Chiyoda-ku (JP)

(72) Inventors: Hiroki Yoshikawa, Niigata (JP); Souichi Fukaya, Niigata (JP); Yukio Inazuki, Niigata (JP); Hideo Nakagawa, Niigata (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 698 days.

This patent is subject to a terminal disclaimer.

(21) Appl. No.: 13/892,524

(22) Filed: May 13, 2013

(65) Prior Publication Data

US 2013/0309599 A1 Nov. 21, 2013

(30) Foreign Application Priority Data

May 16, 2012 (JP) .................................. 2012-112509

(51) Int. Cl.
  *C23C 14/06* (2006.01)
  *C23C 14/08* (2006.01)
  (Continued)

(52) U.S. Cl.
  CPC ...... *C23C 14/0641* (2013.01); *C23C 14/0676* (2013.01); *C23C 14/3407* (2013.01);
  (Continued)

(58) Field of Classification Search
  CPC . C23C 14/3464; C23C 14/352; C23C 14/185; C23C 14/3407; C23C 14/083;
  (Continued)

(56) References Cited

U.S. PATENT DOCUMENTS 4,505,798 A * 3/1985 Ramachandran ... C23C 14/3407
                                                              204/192.15
5,474,864 A    12/1995 Isao et al.
(Continued)

FOREIGN PATENT DOCUMENTS

JP        61-124944 A      6/1986
JP        63000465 A  *    1/1988
(Continued)

OTHER PUBLICATIONS

Derwent Abstract for US 4505798 A.*
(Continued)

*Primary Examiner* — Michael Band
(74) *Attorney, Agent, or Firm* — Oblon, McClelland, Maier & Neustadt, L.L.P.

(57) ABSTRACT

The method for manufacturing a photomask blank according to the present invention, when manufacturing a photomask blank having at least one functional layer on a transparent substrate, in a step of film-formation of such a functional film where the functional film includes a chromium-containing element and an a metallic element that is capable of bringing a mixture of the metallic element and the chromium into a liquid phase at a temperature of 400° C. or lower, a chromium target (target A) and a target (target B) mainly containing at least one kind of the metallic element are simultaneously sputtered (co-sputtered). The present invention provides a technique for manufacturing a functional film having a small variation in its characteristics such as optical density and a low detect, and showing a high etching rate.

9 Claims, 1 Drawing Sheet

(51) Int. Cl.

| | | |
|---|---|---|
| *C23C 14/34* | (2006.01) | |
| *C23C 14/35* | (2006.01) | |
| *H01J 37/34* | (2006.01) | |
| *G03F 1/00* | (2012.01) | |
| *G03F 1/50* | (2012.01) | |
| *G03F 7/20* | (2006.01) | |
| *G03F 1/46* | (2012.01) | |
| *G03F 1/54* | (2012.01) | |
| *G03F 1/80* | (2012.01) | |
| *C23C 14/18* | (2006.01) | |

(52) U.S. Cl.
CPC ........ *C23C 14/3464* (2013.01); *C23C 14/352* (2013.01); *G03F 1/00* (2013.01); *G03F 1/46* (2013.01); *G03F 1/50* (2013.01); *G03F 1/54* (2013.01); *G03F 1/80* (2013.01); *G03F 7/20* (2013.01); *H01J 37/34* (2013.01); *H01J 37/3426* (2013.01); *H01J 37/3429* (2013.01); *C23C 14/083* (2013.01); *C23C 14/086* (2013.01); *C23C 14/185* (2013.01)

(58) Field of Classification Search
CPC . C23C 14/086; G03F 1/46; G03F 1/54; G03F 1/80; G03F 1/00; G03F 1/50; G03F 7/20; H01J 37/3426; H01J 37/34; H01J 37/3429
See application file for complete search history.

(56) References Cited

U.S. PATENT DOCUMENTS

| | | | |
|---|---|---|---|
| 5,580,428 A * | 12/1996 | Krivokapic | ......... C23C 14/3407 204/192.12 |
| 6,114,074 A | 9/2000 | Carpi et al. | |
| 2003/0118920 A1 | 6/2003 | Johnstone et al. | |
| 2003/0134207 A1 | 7/2003 | Shiah et al. | |
| 2005/0186485 A1 | 8/2005 | Yoshikawa et al. | |
| 2006/0251973 A1 | 11/2006 | Takaki et al. | |
| 2007/0212618 A1 | 9/2007 | Yoshikawa et al. | |
| 2007/0212619 A1 | 9/2007 | Yoshikawa et al. | |
| 2013/0177841 A1 | 7/2013 | Sakai et al. | |
| 2013/0230796 A1 | 9/2013 | Yoshikawa et al. | |
| 2013/0309598 A1 | 11/2013 | Fukaya et al. | |
| 2013/0309600 A1 | 11/2013 | Fukaya et al. | |
| 2013/0309601 A1 | 11/2013 | Fukaya et al. | |

FOREIGN PATENT DOCUMENTS

| | | |
|---|---|---|
| JP | 63-58446 A | 3/1988 |
| JP | 4-34436 A | 2/1992 |
| JP | 6-138650 A | 5/1994 |
| JP | 6-250375 A | 9/1994 |
| JP | 7-140635 | 6/1995 |
| JP | 8-272074 A | 10/1996 |
| JP | 2000-284466 A | 10/2000 |
| JP | 2003-215779 A | 7/2003 |
| JP | 2004-279484 A | 10/2004 |
| JP | 2004-281967 A | 10/2004 |
| JP | 2005-513520 A | 5/2005 |
| JP | 2005-234047 A | 9/2005 |
| JP | 2005-234209 A | 9/2005 |
| JP | 2005-286203 A | 10/2005 |
| JP | 2007-33470 | 2/2007 |
| JP | 2007-241060 | 9/2007 |
| JP | 2007-241065 | 9/2007 |
| JP | 2012-78445 A | 4/2012 |
| JP | 5367913 B2 | 9/2013 |
| JP | 2013-238776 A | 11/2013 |
| JP | 2013-238777 A | 11/2013 |
| JP | 2013-238778 A | 11/2013 |
| WO | WO 2007/074806 A1 | 7/2007 |
| WO | WO 2011/157643 A1 | 12/2011 |
| WO | WO 2012/043695 A1 | 4/2012 |
| WO | WO 2012/070209 A1 | 5/2012 |

OTHER PUBLICATIONS

Japanese Office Action issued Mar. 10, 2015 in Patent Application No. 2012-112509 (without English Translation).
Extended European Search Report issued Sep. 6, 2013, in Patent Application No. 13167567.0.
Wei-che Chang, et al., "Opto-electronic properties of chromium doped indium—tin-oxide films deposited at room temperature", Materials Science and Engineering B, vol. 153, No. 1-3, XP 025693692, Sep. 25, 2008, pp. 57-61.
Shiu-Jen Liu, et al., "Physical properties of polycrystalline Cr-doped $SnO_2$ films grown on glasses using reactive dc magnetron co-sputtering technique", Applied Surface Science, vol. 257, No. 6, XP 027562510, 2011, pp. 2254-2258.
Otto J. Gregory, et al., "A Low TCR Nanocomposite Strain Gage for High Temperature Aerospace Applications", IEEE Sensors, XP 031221136, Oct. 28, 2007, pp. 624-627.
H. Okamoto, "Desk Handbook: Phase Diagrams for Binary Alloys", The Materials Information Society, ASM International, XP 008164003, Dec. 31, 2000, pp. 268-281.

* cited by examiner

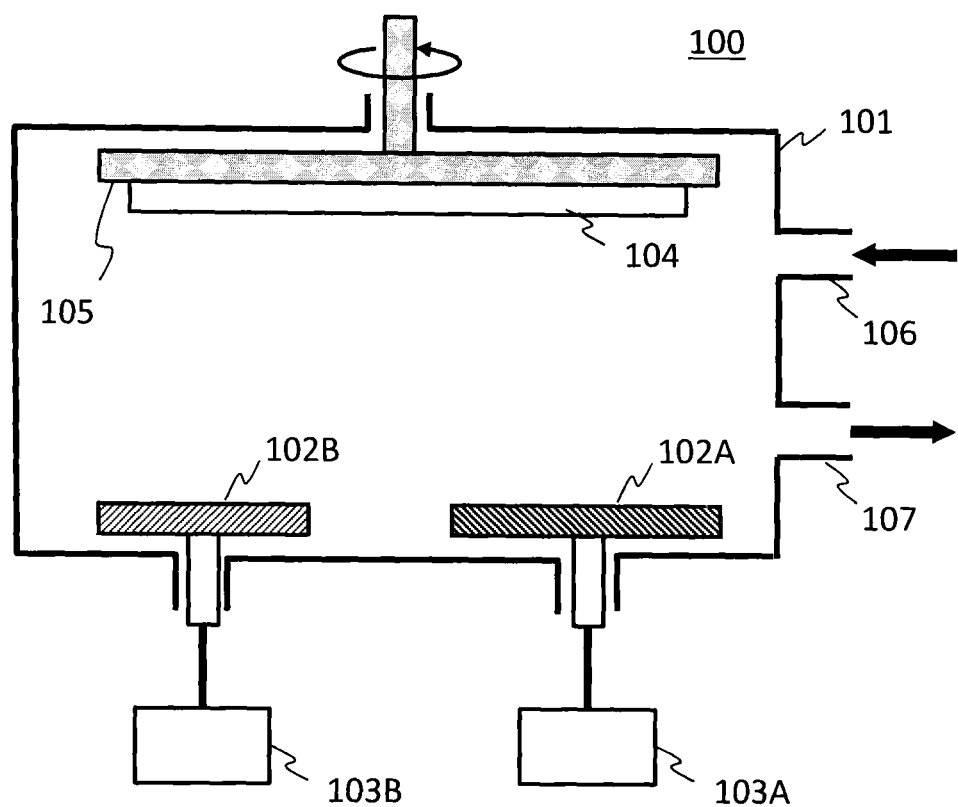

PHOTOMASK BLANK MANUFACTURING METHOD, PHOTOMASK BLANK, PHOTOMASK, AND PATTERN TRANSFER METHOD

CROSS REFERENCES TO RELATED APPLICATIONS

This application claims priority to Japanese Patent Application No. 2012-112509, filed on May 16, 2012.

TECHNICAL FIELD

The present invention relates to a photomask blank and a method for manufacturing the same, a photomask obtained from the photomask blank, and a method for pattern transfer using the photomask.

BACKGROUND ART

In the field of semiconductor technology, research and development for further refinement of patterns have been progressed. In recent years, particularly, with high integration of a large scale integration circuit, refinement of circuit patterns, refinement of wiring patterns, or refinement of contact-hole patterns for wiring between layers forming a cell has been progressed. Thus, a request for microfabrication technology has been increased.

In connection with this, even in the field of technology for photomask production to be used in the process for photolithography in microfabrication, a technique for forming fine and correct circuit patterns (mask patterns) has begun to be demanded.

Generally, reduction projection is performed when forming a pattern on a semiconductor substrate by photolithographic technique. The size of pattern formed on the photomask is therefore approximately four times larger than the side of pattern formed on the semiconductor substrate. However, this does not mean that the desired precision of patterns formed on the photomask is smaller than the patterns formed on the semiconductor substrate. Rather, the precision of patterns formed on the photomask as a master is desired to be higher than actual patterns obtained after exposure.

In today's photolithography technical field, the size of a circuit pattern to be drawn is considerably smaller than the wavelength of light to be used for exposure. Thus, in the case of forming a photomask pattern with a just four-time enlarged circuit pattern, light interference or the like, which is generated under exposure, results in un-transferred original shape on a resist film of a semiconductor substrate.

In some cases, therefore, a pattern formed on the photomask is made more complicated than an actual circuit pattern to reduce an effect of the above light interference or the like. The shape of such a pattern may be, for example, an actual circuit pattern subjected to optical proximity correction (OPC).

Hence, along with a decrease in size of a circuit pattern, a higher precision processing technique has been also desired in a lithographic technique for forming photomask patterns. Although lithography performance may be expressed in limiting resolution, a pattern formed on a photomask as a master desires higher precision than an actual pattern formed after exposure as described above. Thus, limiting resolution required for formation of a photomask pattern is almost equal to or higher than one required in lithography for forming a pattern on a semiconductor base.

Incidentally, when forming a photomask pattern, a resist film is usually formed on the surface of the photomask blank formed of a light-shielding film on a transparent substrate, and a pattern is then drawn (exposed) on the resist film by an electron beam. Subsequently, after obtaining a resist pattern after developing the exposed resist film, a light-shielding film is etched by using this resist pattern as a mask to obtain a light-shielding (film) pattern. The light-shielding (film) pattern thus obtained is served as a photomask pattern.

In this case, the above-mentioned resist film should be thinned depending on the degree of fineness of the light-shielding pattern. This is because, when forming a fine light-shielding pattern while keeping the thickness of the resist film, the ratio (aspect ratio) of the thickness of the resist film to the size of the light-shielding pattern becomes large and causes troubles of failed pattern transfer, falling down or peeling off of the resist pattern, or the like due to deterioration of the shape of the resist pattern.

As a material of the light-shielding film disposed on the transparent substrate, many kinds of materials have so far been proposed. Among them, however, a chromium compound has been practically used because of many know-how on etching, for example.

Dry etching of a chromium-containing material film is generally performed by chlorine-containing dry etching. In many cases, however, chlorine-containing dry etching has a certain level of ability to etch an organic layer. Thus, in the case that a resist pattern is formed on a thin resist film and then used as a mask to etch a light-shielding film, the resist pattern is also etched too much to ignore by chlorine-containing dry etching. As a result, the proper resist pattern, which should be transferred to a light-shield film, cannot be correctly transferred to the light-shielding film.

In order to avoid such inconvenience, a resist material having excellent etching resistance has been requested. However, such a resist material has not been known yet. For this reason, to obtain a light-shielding (film) pattern having high resolution property, a light-shielding film material having higher processing accuracy is required.

For a light-shielding film having higher processing accuracy as compared with a conventional material, there is a report of an attempt to increase the etching rate of a light-shielding film by allowing a chromium compound to contain only a certain amount of a light element.

For example, patent Literature 1 (WO 2007/74806 A) discloses a technique that uses a material mainly containing chromium (Cr) and nitrogen (N) and having an X-ray diffraction peak of substantially CrN (200) as a light-shielding film material to suppress a decrease in thickness of a resist film by increasing the dry etching rate of the light-shielding film.

Furthermore, Patent Literature 2 (JP 2007-33470 A) discloses the invention of a photomask blank where its composition, film thickness, and a laminated structure are suitably designed to obtain desired transmittance T and reflectance R while trying to increases a dry-etching rate by making the composition of a chromium-containing compound of the light-shielding film rich in light element and low in chromium composition as compared with the composition of the conventional film.

CITATION LIST

Patent Literatures

Patent Literature 1: WO 2007/74806 A
Patent Literature 2: JP 2007-33470 A

Patent Literature 3: JP 7-140635 A
Patent Literature 4: JP 2007-241060 A
Patent Literature 5: JP 2007-241065 A

SUMMARY OF THE INVENTION

Technical Problem

When using a light-shielding film material in which a light element is added to a chromium-containing compound, the light-shielding film should not only ensure its improved etching rate but also ensure predetermined optical containing characteristics because the light-shielding film is also served as an optical film. However, the flexibility of the film design enough to simultaneously satisfy both demands is not always high.

Even in the case of using a material in which a light element is added to a chromium-based compound not as a light-shielding film material but as a film material for forming a hard mask, a range of amount of the light element which can be added is naturally limited to ensure the functional aspect of the chromium-based compound. Thus, the flexibility of a film design is not always high.

In other words, from the viewpoint of improving the etching rate of a film while ensuring predetermined optical characteristics, a conventional technique, such as addition of a light element, has limitations. Therefore, another approach using another technique different from such a conventional technique has been desired. In consideration of such a background, the present inventors have studied the use of a chromium-containing material as an optical film, where the material is added with a metal element that is capable of, when mixed with chromium, bringing the mixture into a liquid phase at a temperature of 400° C. or lower.

When the optical film made of such a chromium-containing material is formed by sputtering, a content ratio between the chromium element and the above additive metal element in the optical film should be brought into a suitable range to obtain desired optical characteristics. Typically, in this case, a chromium target that contains the above metallic element only in small amount is prepared and then used in sputtering film-formation. However, adoption of such a film-forming process may cause problems as described below.

Even though a typical chromium target to be used in sputtering film-formation is produced by sintering, the above additive metallic element is capable of, when mixed with chromium, bringing the mixture into a liquid phase at a temperature of 400° C. or lower. Thus, when the above metallic element is added to the chromium target in amount enough to give the desired optical characteristic values of a film and increase the etching rate, the sintering temperature has to be inevitably set to 400° C. or lower. However, even if the sintering is performed at such a comparatively low temperature, the sintering may proceed insufficiently. As a result, the target may have insufficient sintered density or may have insufficient composition distribution.

If a film is formed using a target having insufficient sintered density, foreign matter generated from the target may cause a defect in the film. Furthermore, when a film is formed using a target having unevenly distributed composition, the composition distribution in the surface of the film or between the surfaces of the respective films may also become uneven. As a result, the resulting film may cause a problem that it cannot sufficiently exert its function as an optical film.

The present invention has been made in order to solve these problems and an object thereof is to provide a technique for manufacturing a high-quality optical film (functional film) showing a small variation in its characteristics such as optical density and having a low detect as well as having a high etching rate, a method for manufacturing a photomask blank using such a technique, and so on.

Solution to Problem

To solve the aforementioned problems, a method for manufacturing a photomask blank according to the present invention is one for manufacturing a photomask blank having at least one functional film on a transparent substrate, where the functional film is made of a chromium-containing material including a chromium element and a metallic element that is capable of bringing a mixture of the metallic element and the chromium into a liquid phase at a temperature of 400° C. or lower; and, in a step of forming the functional film, a chromium target (target A) and a target (target B) mainly containing at least one kind of the metallic element are simultaneously sputtered (co-sputtered).

Alternatively, in the step of forming the functional film, it may be configured to use at least one of the target A and the target B two or more.

Preferably, $S_B < S_A$ is given when the total area of the target A is $S_A$ and the total area of the target B is $S_B$.

Preferably, in this case, a ratio ($S_B/S_A$) between the total surface are $S_A$ and the total surface area $S_B$ is set to 0.7 or lower.

Preferably, furthermore, a ratio ($S_B/S_A$) between the total surface are $S_A$ and the total surface area $S_B$ is set to 0.01 or higher.

The functional film includes at least one of a light-shielding film, an anti-reflection film, an etching mask film, and an etching stopper film.

Alternatively, the functional film includes any of a light-shielding film or an anti-reflection film.

Alternatively, the functional film is a light-shielding film.

The photomask blank according to the present invention is a photomask blank manufactured by the above method, where a content ratio ([Me]/[Cr]) between chromium element (Cr) and a metallic element (Me) that is capable of bringing a mixture of the metallic element and the chromium into a liquid phase at a temperature of 400° C. or lower is 0.7 or lower in terms of atomic ratio in the functional film.

In addition, the photomask according to the present invention is a photomask obtained by forming a pattern on the above photomask blank.

In the method for pattern transfer according to the present invention, furthermore, exposure is performed using the photomask and the pattern is then transferred on a photoresist.

Advantageous Effects of Invention

According to the present invention, in a step of forming a functional film where the functional film is formed using a chromium-containing material including a chromium element and a metallic element that is capable of bringing a mixture of the metallic element and the chromium into a liquid phase at a temperature of 400° C. or lower, a chromium target (target A) having a surface area of $S_A$ and a target (target B) mainly containing one kind of the above metal element as a main component and having a surface of $S_A$ ($<S_A$) are simultaneously sputtered (co-sputtered). Therefore, generation of foreign matter from the target is sufficiently suppressed, and a functional film having stable quality can be obtained.

Such a functional film has a small variation in its characteristics such as optical density and a low detect, and also shows a high etching rate. Therefore, it is possible to increase an etching rate while ensuring predetermined optical characteristics.

BRIEF DESCRIPTION OF DRAWINGS

FIG. 1 is a diagram illustrating an exemplary configuration of an apparatus to be used in manufacture of a photomask blank by the method according to the present invention.

DESCRIPTION OF EMBODIMENTS

Hereinafter, embodiments for carrying out the present invention will be described with reference to the drawing. However, the present invention is not limited to these embodiments.

Prior to the description of the present invention, the present inventors will describe the story of why the present inventors have completed the present invention.

As described above, the present inventors have studied the use of a chromium-containing material as an optical film, where the material is added with a metal element that is capable of, when mixed with chromium, bringing the mixture into a liquid phase at a temperature of 400° C. or lower.

During this process, the present inventors have recognized the following matters as problems to be solved: When the above metallic element is added to the chromium target in amount enough to give the desired optical characteristic values of a film and increase the etching rate, the sintering temperature has to be inevitably set to 400° C. or lower; and as a result, the target may have insufficient sintered density or may have insufficient composition distribution.

To solve the problems, it is conceived that an effective method is one for forming a functional film by preparing a target (target B) containing at least one kind of the above metallic element as a main component in addition to a chromium target (target A), and simultaneously sputtering (co-sputtering) them to form a functional film.

Based on the above finding, the method for manufacturing a photomask blank according to the present invention, when manufacturing a photomask blank having at least one functional layer on a transparent substrate, in a step of film-formation of such a functional film where the functional film includes a chromium-containing element and an a metallic element that is capable of bringing a mixture of the metallic element and the chromium into a liquid phase at a temperature of 400° C. or lower, a chromium target (target A) and a target (target B) mainly containing at least one kind of the metallic element are simultaneously sputtered (co-sputtered).

The method for manufacturing the photomask blank according to the present invention may be provided as an embodiment in which each of the above target A and the above target B is used one at a time, or may be provided as an embodiment in which one of them is used two or more at a time, or may be provided as an embodiment in which each of them is used two or more at a time.

However, even in the case of carrying out the above co-sputtering, chromium fine particles flying from the chromium target (target A) attaches the surface of the metal element-containing target (target B). The chromium fine particles may cause another problem in that the particles act as a nucleus to generate a nodule (agglomerated material formed in the target B) causing the generation of a defect in the functional film in the process of film-formation.

Such chromium particles are removable if the sputtering power density (W/cm$^2$) supplied to the target B is increased to a certain degree. However, the content of the above metallic element in the film, which is defined to obtain a functional film having desired optical characteristics, is not so high. Thus, the sputtering power (W) supplied to the target B should be set to a comparatively low value. In other words, obtaining the functional film having desired optical characteristics and preventing the generation of a defect in the functional film by removing chromium fine particles may be contradicting each other from a viewpoint of the supply of sputtering power to the target B.

Therefore, regardless of the sputtering power density (W/cm$^2$) supplied to the target A, it has been desired to suitably control the sputtering power density (W/cm$^2$) supplied to the target B.

However, when the supplied power density (W/cm$^2$) is lowered in order to set the sputtering power (W) supplied to the target B to a comparatively low value, discharge itself may become unstable. To solve this problem, what is necessary is to realize the supplied power density (W/cm$^2$) that leads to a stable discharge even when the sputtering power (W) supplied to the target B is set to a comparatively low value.

In the present invention, therefore, to achieve a supplied power density (W/cm$^2$) that does not lead to an unstable discharge even when the sputtering power (W) supplied to the target B is set to a comparatively low value, the suitable power density (W/cm$^2$) supplied to the target B is achieved by making the total surface area of the target B small. In other words, the total surface area ($S_A$) of the target A and the total surface area ($S_B$) of the target B are made different from each other, $S_B < S_A$, and electric power is supplied to both the targets A and B with their respective optimal power flux densities. Even if the sputtering power (W) supplied to the target B is set to a comparatively low value, the supplied power density (W/cm$^2$) in the range that does not lead to an unstable discharge is achieved.

A ratio ($S_B/S_A$) between such total surface areas $S_A$ and $S_B$ is preferably set to 0.7 or lower and preferably to 0.01 or higher.

The functional film to be formed by such a method includes, for example, at least one of a light-shielding film, an anti-reflection film, an etching mask film, and an etching stopper film, which is formed on a photomask blank. Alternatively, the above functional film includes one of a light-shielding film or an anti-reflection film. Alternatively, the above functional film is a light-shielding film.

Such a method can provide a photomask blank where a content ratio ([Me]/[Cr]) between a chromium element (Cr) and a metallic element (Me) capable of bringing a mixture of the metallic element and the chromium into a liquid phase at a temperature of 400° C. or lower is 0.7 or lower in terms of atomic ratio.

Exposure is performed using a photomask obtained by forming a pattern on such a photomask blank to transfer the pattern on the photoresist.

FIG. 1 is a diagram illustrating an exemplary configuration of an apparatus used in manufacture of a photomask blank according to the above method.

[Sputtering Film-formation System]

In a chamber 101 used in a sputtering film-formation 100 illustrated in this FIGURE, one chromium target (target A: 102A) and one target (target B: 102B) mainly containing a metallic element that is capable of bringing a mixture of the metallic element and the chromium into a liquid phase at a temperature of 400° C. or lower are arranged. Electric power is applied to the target 102A and the target 102B from the power sources 103A and 103B, respectively. In this FIGURE, furthermore, one target A and one target B are illustrated. However, at least one kind of these targets may be provided two or more.

A transparent substrate 104, which is a film-formation substrate for a functional film, is held on a rotatable holder 105 in a state that a film-forming surface thereof faces the surface of the target. An example of such a transparent substrate 104 may be a substrate made of quartz, $CaF_2$, or the like and transparent to exposure light. In the chamber 101, a gas introducing line 106 for introduction of sputtering gas and an exhaust line 107.

The surface area $S_B$ of the target B is designed to be smaller than the surface area $S_A$ of the target A. If there are two or more targets A, the above $S_A$ represents the sum of the total surface areas of the respective targets A. Similarly, if there are two or more targets B, the above $S_B$ represents the sum of the total surface areas of the respective targets B.

By setting the total surface area of the target B to $S_B < S_A$, even in the case that there is a need of lowering electric power (W) supplied to the target B, it becomes possible to generate a stable discharge and to previously prevent the target B from generating a nodule A ratio ($S_B/S_A$) between the total surface areas is preferably set to 0.7 or lower, more preferably to 0.01 or higher. When the total surface area is set to a value higher than 0.7, the discharge of the target B may become unstable under the conditions for allowing the target A to be stably discharged. On the other hand, when the total surface area is set to a value smaller than 0.01, the discharge of the target B may become excess under the conditions for allowing the target A to be stably discharged. As a result, a disadvantage such as melt of a bonding material can be occurred.

[Sputtering Gas]

Sputtering gas is suitably selected according to the composition of the functional film. The inert gas for sputtering is preferably inert gas of neon, argon, krypton, or the like. More preferably, at least one kind of reactive gas selected from oxygen-containing gas, nitrogen-containing gas, and carbon-containing gas is introduced together with the above inert gas. When using such reactive gas as sputtering gas, the film-formation is performed by reactive co-sputtering.

Examples of the above oxygen-containing gas include $CO_2$, NO, and $O_2$. Examples of the above nitrogen-containing gas include NO, $NO_2$, and $N_2$. Example of the above carbon-containing gas include $CH_4$, $CO_2$, and CO. The kind of reactive gas to be used depends on the composition of the functional film of interest.

For example, inert gas such as argon as sputtering gas when a light element is not included in a chromium-containing material including a chromium element and a metallic element that is capable of bringing a mixture of the metallic element and the chromium into a liquid phase at a temperature of 400° C. or lower. In the case of film formation of a functional film containing a light element, reactive sputtering may be performed in one or more kinds of reactive gas, such as nitrogen gas, nitrogen oxide gas, oxygen gas, or carbon oxide gas, or mixture gas of any of those reactive gas and inert gas such as argon (see, for example, JP 7-140635 A (Patent Literature 3)).

The flow rate of sputtering gas is adjusted suitably. The gas flow rate may be constant in the process of film-formation. Alternatively, the gas flow rate may be changed according to the target composition when there is a need of changing the amount of oxygen or the amount of nitrogen in a thickness direction.

Examples of the sputtering method, which can be employed in the present invention, may include, but not specifically limited to, DC sputtering, RF sputtering, RF sputtering, and magnetron sputtering. Furthermore, in the process of sputtering, when the transparent substrate is configured so that a target sputtering surface faces the target is rotated, it is expected to exert an effect of increasing an inner surface uniformity of the characteristics of the functional film obtained.

[Target B]

The target B used in the film-formation of a functional film containing these metallic elements is a target mainly containing the above metallic element, and examples of such a target includes as an indium target, a tin target, and an indium bismuth target. Furthermore, a light element may be included in any of these targets. The target may be, for example, a target made of indium and a light element, such as a target made of indium and oxygen or a target made of indium and oxygen; a target made of tin and a light element such as a target made of tin and oxygen or a target made of tin and nitrogen; or a target made of bismuth and a light element, such as a target made of bismuth and nitrogen or a target made of bismuth and oxygen. Among these targets, the most preferable one is the target made of tin or made of both tin and oxygen.

The light element contained in the target may be carbon. The light element contained in the target may include one or more kind of nitrogen, oxygen, and carbon.

The content of the above metallic element (Me) that is capable of bringing a mixture of the metallic element and the chromium into a liquid phase at a temperature of 400° C. or lower (the composition ratio of Me and an element other than Me: [Me]/[element other than Me]) is preferably 0.5 or higher in atomic ratio. This atomic ratio is preferably 0.7 or higher, further preferably 1.00 or higher.

There is no upper limit of the value of this composition ratio. If there are two or more kinds of metallic element capable of bringing a mixture of the metallic element and the chromium into a liquid phase at a temperature of 400° C. or lower, the target B is formed such that total amount of these metallic elements satisfy the above composition ratio.

Two or more kinds of the target B having different compositions may be used. For example, an indium target and a tin target may be used together, or a target made of indium and a target made of tin and oxygen may be used together. Thus, by making the target B as a plurality of targets, the composition distribution of the functional film in a thickness direction can be designed in various ways.

[Electric Power Applied to Target]

Power density ($W/cm^2$) supplied to each of the target A and the target B is individually controllable, and each of the target A and the target B can be set to a value that leads to a stable discharge. In general, the power density supplied to the chromium target (target A) is 0.5 $W/cm^2$ or higher and 20.0 $W/cm^2$ or lower. Similarly, the power density supplied to the target (target B) mainly containing at least one metallic element capable of bringing a mixture of the metallic element and the chromium into a liquid phase at a temperature of 400° C. or lower is 5 $W/cm^2$ or higher and 20.0 $W/cm^2$ or lower.

When the power density supplied to the target goes out of the above rage downwardly, the discharge of the target tends to be instable. Therefore, the number of defects in the functional film may occur. On the other hand, the power density supplied to the target goes out of the range upwardly, the discharge of the target becomes excess. Thus, disadvantages such as the generation of abnormal discharge and the melt of a bonding material fixing the target on a backing plate tend to occur. As a result, a decrease in quality of the functional film may occur.

[Functional Film]

The functional film prepared as descried above is made of a chromium-containing material including a chromium element and a metallic element that is capable of bringing a mixture of the metallic element and the chromium into a liquid phase at a temperature of 400° C. or lower. It is preferred that a content ratio ([Me]/[Cr]) between a chromium element (Cr) and a metallic element (Me) capable of bringing a mixture of the metallic element and the chromium into a liquid phase at a temperature of 400° C. or lower be 0.7 or lower. A more preferable atomic ratio is 0.4 or lower, and a further preferable atomic ratio is 0.3. Alternatively, the atomic ratio may be 0.2 or lower. The lower limit of the atomic ratio is one that allows an etching rate at the time of dry-etching the functional film to be substantially equal to that of the conventional functional film, and the content ratio is the lower limit, generally 0.01 or higher.

The functional film formed on the transparent substrate is not limited to a single layer structure. Alternatively, it may be a functional film prepared by stacking a plurality of layers.

Furthermore, the functional film is not limited to include a single kind of the metallic element capable of bringing a mixture of the metallic element and the chromium into a liquid phase at a temperature of 400° C. or lower. Alternatively, the functional element may include two or more kinds of the above metallic element.

Examples of such a metallic element include indium, tin, bismuth, thallium, lithium, sodium, potassium, and mercury. Among them, indium ($T_L$=157° C.), tin ($T_L$=232° C.), and bismuth ($T_L$=271° C.) are preferable. In particular, indium ($T_L$=157° C.) and tin ($T_L$=232° C.) are preferable.

In the functional film made of a chromium-containing material according to the present invention, such a chromium-containing material is one that contains a chromium element and a metallic element, where the metallic element is capable of bringing a mixture of the metallic element and the chromium into a liquid phase at a temperature of 400° C. or lower. Examples of such a chromium-containing material include a chromium metal and chromium compounds such as chromium oxide, chromium nitride, chromium carbide, chromium oxynitride, chromium oxide carbide, chromium nitride carbide, and chromium oxide nitride carbide. Among them, chromium nitride, chromium oxynitride, and chromium oxide nitride carbide are particularly preferred.

A film having the same characteristics as those of the conventional chromium-containing material film and having an improved dry-etching rate can be obtained by using the functional film made of a chromium-containing material according to the present invention as a light-shielding film (see, Patent Literatures 1 and 2), a hard mask film (Patent Literature 4: JP 2007-241060 A), an etching stopper (Patent Literature 5: JP 2007-241065 A), or the like. As a result, the patterning precision of an inorganic material film can be improved without any specific design change of the chromium-containing material film.

[Light-shielding Film]

In the case of using the functional film of the present invention as a light-shielding film, the film may be one made of a chromium-containing material including a chromium element and a metallic element that is capable of bringing a mixture of the metallic element and the chromium into a liquid phase at a temperature of 400° C. or lower. Alternatively, the film may be preferably made of an oxide, nitride, oxynitride, oxycarbonitride, or oxycarbonitride of chromium and the above metallic element. In particular, a metal-rich composition film (unsaturated metal compound film) in which the contents of oxygen, nitrogen, and carbon are smaller than their stoichiometric amounts is preferred.

As described above, examples of the above metallic element include indium, tin, bismuth, thallium, lithium, sodium, potassium, and mercury. Among them, indium ($T_L$=157° C.), tin ($T_L$=232° C.), and bismuth ($T_L$=271° C.) are preferable. In particular, indium ($T_L$=157° C.) and tin ($T_L$=232° C.) are preferable.

According to the investigation of the present inventors, the content of the above metallic element in the light-shielding film is preferably 0.01 atomic % or higher. Such a light-shielding film has a significant improvement in etching rate under general chlorine-containing dry etching conditions.

For the purpose of improving the etching rate of a light-shielding film at the time of chlorine-containing dry etching under general conditions, the content of the above metallic element in a specific region in a thickness direction may be 0.01 atomic % or higher. The content of the metallic element is preferably 0.5 atomic % or higher, further preferably 1 atomic % or higher.

Although there is no specific upper limit of the content of the above metallic element, an excess content thereof leads to difficulty in obtaining desired characteristics. This value is generally 40 atomic % or lower, preferably 20 atomic % or lower.

The above metallic element does not need to be uniformly distributed in the light-shielding film in the thickness direction (depth direction profile) of the film, and it may have a profile having a change in concentration in the thickness (depth) direction of the film. For example, when the profile is of a gradual decrease in concentration of the above metallic element from the substrate side to the surface side of the light-shielding film, a good cross-sectional shape of the film under chromium-containing dry etching can be obtained.

The light-shielding film may be configured in any of other various variations. For example, the light-shielding film may be a stack of a layer made of a chromium-containing material including an a metallic element that is capable of bringing a mixture of the metallic element and chromium into a liquid phase at a temperature of 400° C. or lower and a layer made of a chromium-containing material without a metallic element.

For example, the laminated structure may be configured to have an upper layer made of a chromium-containing material which does not contain an a metallic element that is capable of bringing a mixture of the metallic element and the chromium into a liquid phase at a temperature of 400° C. or lower and a lower layer made of a chromium-containing material including a metallic element that is capable of bringing a mixture of the metallic element and the chromium into a liquid phase at a temperature of 400° C. or lower. In this case, the cross-sectional shape of the film at the time of chlorine-containing dry etching can be maintained good by increasing only the etching rate of the lower layer (on the substrate side) in contrast to the etching rate of the upper layer (on the surface side).

Such a laminate structure may be configured in any of other various variations. For example, it may have a structure in which a plurality of layers that are respectively made of chromium-containing materials with different contents of the above metallic elements. Even in the case of such a laminated structure, electric power applied to each of the target A and the target B is controlled within a range that allows the target to be stably discharged. Sputtering of the target B can be temporarily unrequired. In this case, there is no need of completely stopping the supply of electric power to the target B. The electric power may be supplied as long as it does not cause unstable discharge. Therefore, the generation of abnormal discharge at the time of restarting the supply of electric power which has been temporally stopped.

In the case of a light-shielding film having a laminated structure is one in which an antireflection layer and a light-shielding layer are stacked together, it is possible to provide a variation in which only the antireflection layer may have a content of the above metal element of 0.01 atomic % or higher, or only the light-insulating layer may have a content of the above metallic element is 0.01 atomic % or higher.

When using the functional film made of the chromium-containing material of the present invention as a light-shielding film provided in a photomask blank, just as in the case with the conventional inorganic film, a light element such as oxygen or nitrogen, or further carbon or hydrogen can be suitably added if needed to keep desired optical functions and chemical functions.

In this case, to form a pattern of a half pitch node of 40 nm, the light-shielding film has a film thickness of 75 nm or lower and the resist film has a film thickness of 150 nm or lower.

[Hard Mask Film]

The functional film made of a chromium-containing material including a chromium element and an a metallic element that is capable of bringing a mixture of the metallic element and the chromium into a liquid phase at a temperature of 400° C. or lower can be used as a hard mask film for micro-processing of a photomask blank, for example. In this case, as a preferred variation, in addition to a chromium metal film mainly containing at least one kind of a metallic element that is capable of bringing a mixture of the metallic element and the chromium into a liquid phase at a temperature of 400° C. or lower as a principal component, an exemplary film can be of a chromium compound containing a metallic element that is capable of bringing a mixture of the metallic element and the chromium into a liquid phase at a temperature of 400° C. or lower and one or more kind of a light element selected from oxygen, nitrogen, and carbon.

Examples of the chromium-containing material used in such a hard mask film include chromium oxide, chromium nitride, chromium oxynitride, chromium oxide carbide, chromium nitride carbide, and chromium oxynitride carbide.

Furthermore, when such a functional film made of a chromium-containing material film is used as a hard mask film formed on a photomask blank used in production of a photomask for forming a resist pattern of 50 nm or lower, the film thickness is preferably 1 to 30 nm, particularly preferably 1 to 10 nm.

[Etching Stopper Film]

When using the functional film made of a chromium-containing material of the present invention as an etching stopper film of a photomask blank, the same material as that of the etching mask film can be selected.

If the thickness of the etching stopper film of such a material is 1 to 30 nm, any problem due to crude density dependence in processing of an etching stopper film cannot be generated. In addition, a good etching mask effect can be obtained in processing of a film or a transparent substrate provided under the etching stopper film. Thus, the etching precision of a film or a transparent substrate provided under the etching mask film can be increased. If the thickness of an etching stopper film is set to 2 to 20 nm, a further preferable etching mask effect can be obtained.

[Dry Etching]

The functional film made of a chromium-containing material, which is obtained according to the present invention, can be dry-etched by chlorine gas containing oxygen in a manner similar to the conventional chromium-containing material film that does not contain any metallic element capable of bringing a mixture of the metallic element and the chromium into a liquid phase at a temperature of 400° C. or lower. The etching rate of the functional film under the same conditions is significantly high as compared with the conventional chromium-containing material film.

The dry etching can be performed, for example, using gas of chlorine gas and oxygen gas at a mixture ratio ($Cl_2$ gas:$O_2$ gas) of 1:2 to 20:1 in terms of volumetric flow rate, and optionally mixed with inert gas such as helium (He).

Here, the present invention will be described in details with reference to examples.

EXAMPLES

Example

In this example, a chromium (Cr) target (target A) of 6 inches in diameter and a tin (Sn) target (target B) of 5 inches in diameter were prepared on a quartz substrate of 152 mm on a side and 6 mm in thickness. Therefore, the ratio ($S_B/S_A$) of the total surface area of the target A and the total surface area of the target B is 25/36 (approximately 0.694). Different electric powers are applied to the targets and the targets were then co-sputtered by a DC-sputtering method to form a Sn-containing CN film of 44 nm in thickness. The composition of the CrON film was Cr:Sn:O:N=4:1:5:2 (atomic ratio). Therefore, the content ratio [[Sn]/[Cr]] of Cr and Sn in the film is 0.25 in atomic ratio.

The content of tin in the CrON film was adjusted by setting electric powers applied to the chromium target and the tin target to 1000 W and 400 W, respectively. Sputtering gas used was a mixed gas of Ar:$O_2$:$N_2$=5:3:6. The gas pressure in the chamber in sputtering was 0.1 Pa.

Film-formation of the above CrON film was performed 10 times, and 10 samples obtained were then evaluated with respect to variations in optical density and the number of defects.

Variations in optical density were evaluated. That is, the optical density of the center portion of the film was measured at a wavelength of 193 nm, and variations between samples were then evaluated. As a result, variations in optical density were ±0.02%.

The number of defects was evaluated on the above 10 samples. The number of defects of 0.2 μm or more in size was counted by GM-1000 manufactured by Hitachi Engineering Co., Ltd, followed by calculation of an average value. As a result, the number of defects was 0.8/sample.

Such a functional film obtained in the present invention has a small variation in its characteristics such as optical density and a low detect, and also shows a high etching rate. Therefore, it is possible to increase an etching rate while ensuring predetermined optical characteristics.

Such a functional film can be formed by the sputtering device according to the present invention.

The sputtering device of the present invention includes a chromium target (target A) and a target (target B) as separate film-forming targets, where the target B mainly contains a metallic element that is capable of bringing a mixture of the metallic element and the chromium into a liquid phase at a temperature of 400° C. or lower as a principal component. Here, electric power is independently supplied to the film-forming targets, and the surface area $S_B$ of the target B is designed smaller than the surface area $S_A$ of the target A.

The sputtering device of the present invention can be designed such that at least one of the target A and the target B is arranged more than one.

Preferably, a ratio ($S_B/S_A$) between the total surface area $S_B$ of the target B and the total surface area $S_A$ of the target A is 0.7 or lower and 0.01 or higher.

Furthermore, the sputtering device of the present invention includes a holder configured to be in-plane rotatable, and it may be designed such that a sputtering substrate for film formation is held on the holder while a film-forming surface of the sputtering substrate is kept facing the surface of the target.

INDUSTRIAL APPLICABILITY

The present invention provides a functional film having a small variation in its characteristics such as optical density and a low detect, and also showing a high etching rate. According to the present invention, there is provided a functional film that makes possible to increase an etching rate while ensuring predetermined optical characteristics.

REFERENCE SINS LIST

100 Sputtering film-formation system
101 Chamber
102A Target A
102B Target B
103A, 103B Power source
104 Transparent Substrate
105 Holder
106 Gas Introducing Line
107 Exhaust Line

The invention claimed is:

1. A method for manufacturing a photomask blank, said photomask blank comprising at least one functional film on a transparent substrate, wherein
said at least one functional film is made of a chromium-containing material including a chromium element and a tin (Sn) element as a metallic element that is capable of bringing a mixture of the metallic element and the chromium into a liquid phase at a temperature of 400° C. or lower; and wherein
a content ratio ([Sn]/[Cr]) is 0.7 or lower in terms of atomic ratio, and
said at least one functional film is formed by simultaneously sputtering at least one chromium target (target A) and at least one target (target B) comprising tin (Sn) in an atmosphere comprising nitrogen gas, and
wherein at least one of said at least one functional film is a light-shielding film having a content of tin (Sn) of 20 atomic % or lower, and
wherein power density supplied to each of target A and target B is individually controlled, and
wherein the power density applied to target A is 0.5 W/cm² to 20 W/cm² and the power density applied to target B is 5 W/cm² to 20 W/cm², and
wherein $S_B<S_A$, when a total surface area of target A is $S_A$ and a total surface area of target B is $S_B$.

2. The method for manufacturing a photomask blank according to claim 1, wherein said at least one functional film is formed by simultaneously sputtering more than one of said at least one target A or said at least one target B.

3. The method for manufacturing a photomask blank according to claim 1, wherein a ratio ($S_B/S_A$) between $S_A$ and $S_B$ is 0.7 or lower.

4. The method for manufacturing a photomask blank according to claim 3, wherein a ratio ($S_B/S_A$) between $S_A$ and the total surface area $S_B$ is 0.01 or higher.

5. The method for manufacturing a photomask blank according to claim 1, wherein said photomask blank comprises a stack of a plurality of functional films.

6. The method for manufacturing a photomask blank according to claim 1, wherein said at least one functional film is formed by simultaneously sputtering more than one of said at least one target A.

7. The method for manufacturing a photomask blank according to claim 1, wherein said at least one functional film is formed by simultaneously sputtering more than one of said at least one target B.

8. The method for manufacturing a photomask blank according to claim 1, wherein said at least one functional film is formed by simultaneously sputtering more than one of said at least one target A and more than one of said at least one target B.

9. The method for manufacturing a photomask blank according to claim 1, wherein a ratio ($S_B/S_A$) between $S_A$ and $S_B$ is 0.01 to 0.7 or lower.

* * * * *